United States Patent
Nam et al.

(10) Patent No.: US 9,099,609 B2
(45) Date of Patent: Aug. 4, 2015

(54) METHOD OF FORMING A NON-POLAR/SEMI-POLAR SEMICONDUCTOR TEMPLATE LAYER ON UNEVENLY PATTERNED SUBSTRATE

(75) Inventors: Ok Hyun Nam, Seoul (KR); Geun Ho Yoo, Incheon (KR)

(73) Assignees: Seoul Viosys Co., Ltd, Ansan-si (KR); Korea Polytechnic University Industry Academic Cooperation Foundation, Siheung-si (KR)

(*) Notice: Subject to any disclaimer, the term of this patent is extended or adjusted under 35 U.S.C. 154(b) by 176 days.

(21) Appl. No.: 13/392,410

(22) PCT Filed: Aug. 27, 2010

(86) PCT No.: PCT/KR2010/005763
§ 371 (c)(1), (2), (4) Date: Feb. 24, 2012

(87) PCT Pub. No.: WO2011/025291
PCT Pub. Date: Mar. 3, 2011

(65) Prior Publication Data
US 2012/0153257 A1 Jun. 21, 2012

(30) Foreign Application Priority Data
Aug. 27, 2009 (KR) .................. 10-2009-0080058

(51) Int. Cl.
*H01L 21/20* (2006.01)
*H01L 33/20* (2010.01)
(Continued)

(52) U.S. Cl.
CPC ............... *H01L 33/20* (2013.01); *H01L 33/16* (2013.01); *H01L 33/0062* (2013.01)

(58) Field of Classification Search
CPC ...... H01L 33/0062; H01L 33/20; H01L 33/16
USPC ............................... 257/E29.09; 438/47, 479
See application file for complete search history.

(56) References Cited

U.S. PATENT DOCUMENTS 4,176,003 A * 11/1979 Brower et al. ............... 430/313
4,574,093 A * 3/1986 Cox ............................. 117/102
(Continued)

FOREIGN PATENT DOCUMENTS

JP 2005-064492 3/2005
JP 2007-273659 10/2007
(Continued)

OTHER PUBLICATIONS

International Search Report of PCT/KR2010/005763 dated, Apr. 26, 2011.

*Primary Examiner* — Caleb Henry
*Assistant Examiner* — Alexander Belousov
(74) *Attorney, Agent, or Firm* — H.C. Park & Associates, PLC

(57) ABSTRACT

Provided are a high-quality non-polar/semi-polar semiconductor device with reduced defect density and improved internal quantum efficiency and light extraction efficiency, and a manufacturing method thereof. The manufacturing method is a method for manufacturing a semiconductor device, in which a template layer and a semiconductor device structure are formed on a sapphire substrate having a crystal plane for growing a non-polar or semi-polar nitride semiconductor layer. The sapphire substrate is etched to form uneven patterns, and the template layer including a nitride semiconductor layer and a GaN layer is formed on the sapphire substrate in which the uneven patterns are formed.

10 Claims, 7 Drawing Sheets

(51) Int. Cl.
*H01L 33/16* (2010.01)
*H01L 33/00* (2010.01)

(56) References Cited

U.S. PATENT DOCUMENTS

| | | | | |
|---|---|---|---|---|
| 5,980,632 | A | * | 11/1999 | Iyechika et al. ............... 117/90 |
| 6,413,627 | B1 | * | 7/2002 | Motoki et al. ............... 428/332 |
| 6,616,757 | B1 | * | 9/2003 | Melnik et al. ............... 117/102 |
| 6,657,232 | B2 | * | 12/2003 | Morkoc ............... 257/76 |
| 6,673,149 | B1 | * | 1/2004 | Solomon et al. ............... 117/90 |
| 2005/0133798 | A1 | | 6/2005 | Jung et al. |
| 2005/0133812 | A1 | | 6/2005 | Kim et al. |
| 2007/0045654 | A1 | | 3/2007 | Choi et al. |
| 2007/0221948 | A1 | | 9/2007 | Choi et al. |
| 2008/0251781 | A1 | * | 10/2008 | Han et al. ............... 257/13 |
| 2009/0079035 | A1 | * | 3/2009 | Wang ............... 257/615 |
| 2009/0114933 | A1 | | 5/2009 | Osawa et al. |
| 2009/0206373 | A1 | * | 8/2009 | Yafune et al. ............... 257/256 |
| 2009/0212319 | A1 | * | 8/2009 | Muraki et al. ............... 257/103 |

FOREIGN PATENT DOCUMENTS

| | | |
|---|---|---|
| KR | 10-2005-0062286 | 6/2005 |
| KR | 10-2005-0062832 | 6/2005 |
| KR | 10-2007-0025939 | 3/2007 |
| KR | 10-2007-0095181 | 9/2007 |

* cited by examiner

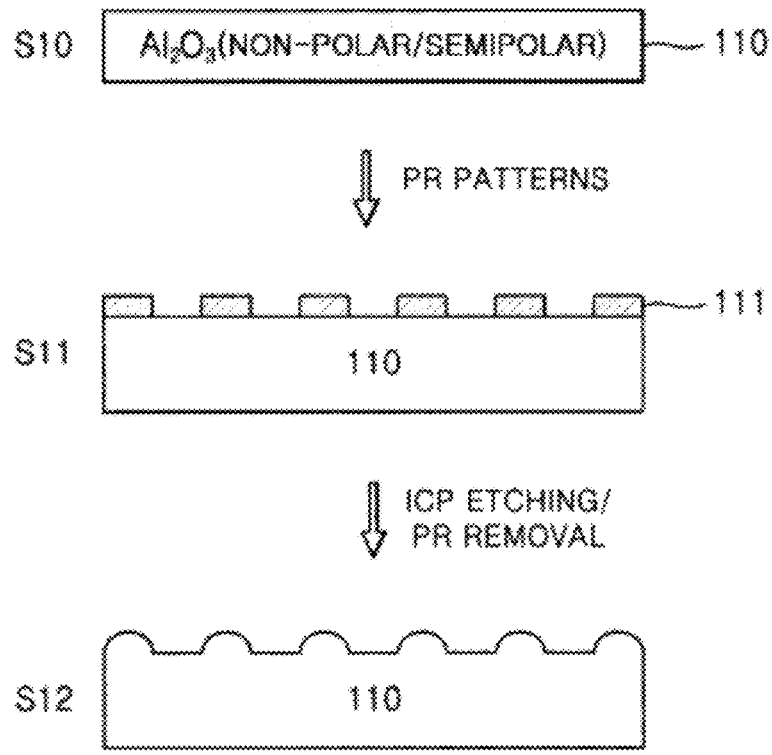
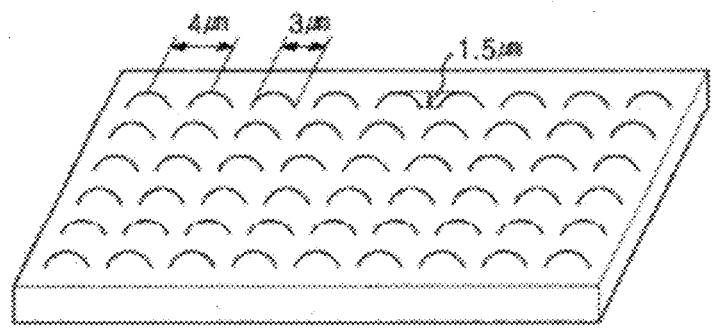

METHOD OF FORMING A NON-POLAR/SEMI-POLAR SEMICONDUCTOR TEMPLATE LAYER ON UNEVENLY PATTERNED SUBSTRATE

CROSS-REFERENCE TO RELATED APPLICATIONS

This application is the National Stage of International Application PCT/KR2010/005763, filed on Aug. 27, 2010, and which claims priority from and the benefit of Korean Patent Application No. 10-2009-0080058, filed on Aug. 27, 2009, both of which are herein incorporated by reference for all purposes as if fully set forth herein.

BACKGROUND OF THE INVENTION

1. Field of the Invention

The present invention relates to a semiconductor device and a manufacturing method thereof, and more particularly, to a high-quality non-polar/semi-polar semiconductor device and a manufacturing method thereof. In the high-quality non-polar/semi-polar semiconductor device, a non-polar/semi-polar nitride semiconductor crystal is formed on a sapphire crystal plane, which enables the growth of a non-polar/semi-polar nitride semiconductor layer, in order that a piezoelectric effect generated in a polar nitride semiconductor layer may not occur in a nitride semiconductor layer. In addition, a template layer is formed on the sapphire crystal plane etched in uneven patterns to reduce the defect density of the semiconductor device and improve the internal quantum efficiency and light extraction efficiency thereof.

2. Discussion of the Background

Since group III-V nitride semiconductors (also simply called "nitride semiconductors"), such as GaN, have excellent physical and chemical properties, they have recently been recognized as the essential material for semiconductor optical devices, such as a light emitting diode (LED), a laser diode (LD), and a solar cell. In general, group III-V nitride semiconductors are composed of a semiconductor material having an empirical formula of $In_xAl_yGa_{1-x-y}N$ ($0 \le x \le 1$, $0 \le y \le 1$, $0 \le x+y \le 1$). Such nitride semiconductor optical devices are applied as light sources for a variety of products, such as a keypad of a mobile phone, an electronic display board, and a lighting device.

In particular, as digital products using LEDs or LDs have evolved, there is an increasing demand for nitride semiconductor optical devices having higher brightness and higher reliability. For example, a side view LED used as a backlight of a mobile phone is required to be brighter and thinner as the mobile phone tends to be slimmer. However, if a nitride semiconductor, such as polar GaN, is grown on a sapphire substrate using a C-plane (e.g., (0001) plane) as a sapphire crystal plane, the internal quantum efficiency may be reduced by a piezoelectric effect caused by the formation of a polarization field.

Accordingly, it is necessary to form a non-polar/semi-polar nitride semiconductor on a sapphire substrate. However, crystal defects, such as a line defect and a point defect, may be caused by a lattice mismatch between sapphire, which is suitable for the formation of a template layer using non-polar/semi-polar GaN or the like, and a non-polar/semi-polar nitride semiconductor template layer, which is formed on the sapphire, and a difference in coefficient of thermal expansion between constituent elements. Such crystal defects have a bad influence on the reliability of an optical device, for example, a resistance to electrostatic discharge (ESD), and are also the cause of current leakage within the optical device. As a result, the quantum efficiency of the optical device may be reduced, leading to the performance degradation of the optical device.

A variety of efforts have been made to reduce a crystal defect of a nitride semiconductor layer. One of these efforts is the use of a selective epitaxial growth. However, these efforts require high costs and complicated processes, such as $SiO_2$ mask deposition. In addition, a crystal defect may be reduced by forming a low-temperature buffer layer on a sapphire substrate and then forming GaN thereon. However, this is not enough to solve a crystal defect problem of an optical device. Therefore, it is necessary to solve a problem that degrades the brightness and reliability of an optical device due to a crystal defect.

SUMMARY OF THE INVENTION

An aspect of the present invention is directed to a high-quality non-polar/semi-polar semiconductor device and a manufacturing method thereof. In the high-quality non-polar/semi-polar semiconductor device, a nitride semiconductor crystal is formed on a sapphire crystal plane, which enables the growth of a non-polar/semi-polar nitride semiconductor layer, in order to eliminate a piezoelectric effect generated in a polar GaN nitride semiconductor. In addition, a template layer is formed on the sapphire crystal plane etched in uneven patterns. Therefore, a defect of the template layer may be reduced to improve crystal quality. A range of a light escape angle may be expanded to improve light extraction efficiency.

According to an embodiment of the present invention, a method for manufacturing a semiconductor device, in which a template layer and a semiconductor device structure are formed on a sapphire substrate having a crystal plane for growing a non-polar or semi-polar nitride semiconductor layer, includes: etching the sapphire substrate to form uneven patterns; and forming the template layer including a nitride semiconductor layer and a GaN layer on the sapphire substrate in which the uneven patterns are formed.

In the semiconductor device manufactured by the above-described method, the crystal plane of the sapphire substrate may include an A-plane, an M-plane, and an R-plane.

The uneven patterns may have a circular shape, a semicircular shape, a multi-stripe shape, or a polygonal shape including a triangular shape and a rectangular shape.

The uneven patterns may be formed through an anisotropic etching process or an isotropic etching process.

An array of the uneven patterns may be formed to have a width of 10 nanometers to 100 micrometers and a height of 10 nanometers to 100 micrometers at each interval of 10 nanometers to 100 micrometers.

The nitride semiconductor layer may include an $In_xAl_yGa_{1-x-y}N$ layer ($0 \le x \le 1$, $0 \le y \le 1$, $0 \le x+y \le 1$).

The semiconductor device may include a light emitting diode (LED) including an active layer between an n-type nitride semiconductor layer and a p-type nitride semiconductor layer. The semiconductor device may include an optical device including a light emitting diode, a laser diode, a photo detector, or a solar cell, or may include an electronic device including a transistor.

According to the semiconductor device and the manufacturing method thereof set forth above, the sapphire crystal plane, which enables the growth of the non-polar/semi-polar nitride semiconductor layer, is etched to form uneven patterns, and the template layer is formed thereon. Then, the nitride semiconductor optical device is formed on the template layer. Therefore, the nitride semiconductor layer may have a low crystal defect density, improving the reliability and performance (e.g., brightness) of the semiconductor device.

BRIEF DESCRIPTION OF THE DRAWINGS

FIG. 3 is a cross-sectional view for explaining a process of forming circular uneven patterns on a sapphire substrate according to an embodiment of the present invention.

FIG. 4 is a perspective view of the circular uneven patterns formed through the process of FIG. 3.

DETAILED DESCRIPTION OF THE ILLUSTRATED EMBODIMENTS

Figure 1:
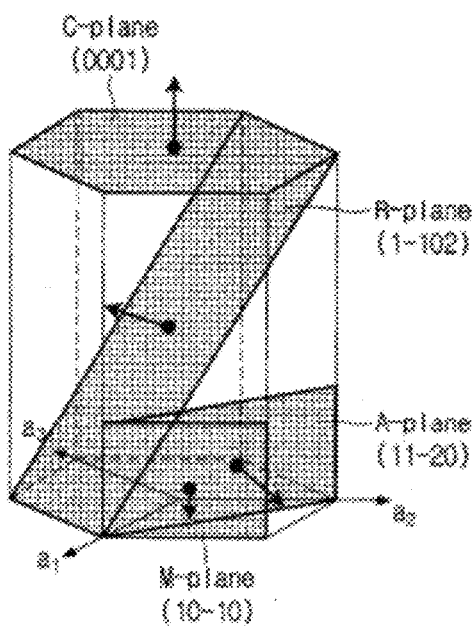
FIG. 1 illustrates a sapphire crystal structure for explaining a crystal plane of a sapphire substrate.

Exemplary embodiments of the present invention will be described below in detail with reference to the accompanying drawings. These embodiments are provided so that this disclosure will be thorough and complete, and will fully convey the scope of the invention to those skilled in the art. The invention may, however, be embodied in many different forms and should not be construed as being limited to the embodiments set forth herein. Throughout the drawings and description, like reference numerals will be used to refer to like elements.

FIG. 1 illustrates a sapphire crystal structure for explaining a crystal plane of a sapphire substrate.

In general, if a nitride semiconductor, such as polar GaN, is grown on a sapphire substrate using a C-plane (e.g., (0001) plane) as a sapphire crystal plane, as illustrated in FIG. 1, the internal quantum efficiency may be reduced by a piezoelectric effect caused by the formation of a polarization field.

In an embodiment of the present invention, a nitride semiconductor optical device structure, such as an LED, an LD, a photo detector, or a solar cell, is formed on a sapphire substrate, and an A-plane (e.g., (11-20) plane), an M-plane (e.g., (10-10) plane), or an R-plane (e.g., (1-102) plane) in FIG. 1 is used as a crystal plane of the sapphire substrate, so that a non-polar or semi-polar nitride semiconductor layer can be grown thereon. If necessary, the C-plane may be used as the crystal plane of the sapphire substrate, and a non-polar or semi-polar nitride semiconductor layer may be formed thereon.

Figure 2:
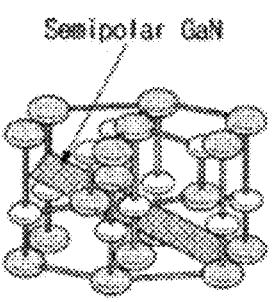
FIG. 2 illustrates a semi-polar GaN crystal structure for explaining a semi-polar nitride semiconductor layer.

In particular, a substrate used in an embodiment of the present invention is a sapphire ($Al_2O_3$) substrate in which uneven patterns are formed. For example, an M-plane may be selected as a crystal plane of a sapphire substrate, and uneven patterns may be formed. Then, a semi-polar nitride semiconductor layer grown in a direction perpendicular to a (11-22) plane may be formed on the uneven patterns, as illustrated in FIG. 2. In addition, even when an A-plane is selected as a crystal plane of a sapphire substrate, uneven patterns may be formed, and a semi-polar nitride semiconductor layer may be formed thereon. Moreover, an R-plane may be selected as a crystal plane of a sapphire substrate, and uneven patterns may be formed. Then, a non-polar nitride semiconductor layer grown in a direction perpendicular to a (11-20) plane may be formed on the uneven patterns.

Even in the case of using a sapphire substrate which enables the growth of a nitride semiconductor layer such as non-polar or semi-polar GaN, if a template layer including a nitride semiconductor layer is formed on the sapphire substrate, many crystal defects, such as a line defect and a point defect, may be caused by a lattice mismatch and a difference in coefficient of thermal expansion between elements. Such crystal defects have a bad influence on the reliability of an optical device, for example, a resistance to electrostatic discharge (ESD), and are also the cause of current leakage. As a result, the quantum efficiency of the optical device may be reduced, leading to the performance degradation of the optical device. In an embodiment of the present invention, such problems may be solved by forming uneven patterns on a sapphire substrate which enables the growth of a non-polar or semi-polar nitride semiconductor layer.

The following description will be given on a method for manufacturing a semiconductor optical device. In order to form a non-polar or semi-polar nitride semiconductor layer, an A-plane, an M-plane, or an R-plane is used as a crystal plane of a sapphire substrate, and the sapphire substrate is etched to form uneven patterns. Then, a non-polar or semi-polar nitride semiconductor layer is formed on the uneven patterns. The semiconductor optical device refers to a nitride semiconductor optical device, such as an LED, an LD, a photo detector, or a solar cell. Although an LED will be described as an example of the semiconductor optical device, the invention is not limited thereto. The invention may also be similarly applied to a method for manufacturing other nitride semiconductor optical devices, such as an LD, a photo detector, or a solar cell, by forming uneven patterns on a sapphire substrate, which uses an A-plane, an M-plane, or an R-plane as a crystal plane, and forming a non-polar or semi-polar nitride semiconductor layer on the uneven patterns. Moreover, the method for manufacturing the semiconductor optical device according to the present invention may also be similarly applied to a method for manufacturing a semiconductor electronic device, such as a general diode or transistor.

FIG. 3 is a cross-sectional view for explaining a process of forming circular uneven patterns on a sapphire substrate according to an embodiment of the present invention.

First, a sapphire substrate 110, which enables the growth of a non-polar or semi-polar nitride semiconductor layer, is prepared (S10).

A photoresist (PR) is coated on the sapphire substrate 110, and a photolithography process of exposing the coated PR using a photo mask having circular patterns (arrays) is performed to form circular PR patterns 111 on the sapphire substrate 110 (S11).

The circular PR patterns 111 formed on the sapphire substrate 110 are etched through an anisotropic etching process such as inductively coupled plasma (ICP) (S12). Accordingly, regions other than the region where the PR patterns 111 remain on the sapphire substrate 110 may be etched. After the etching process, the remaining PR is removed. Then, circular uneven patterns, as illustrated in FIG. 3, may be formed on the sapphire substrate 110 through an appropriate cleaning process.

Figure 5:
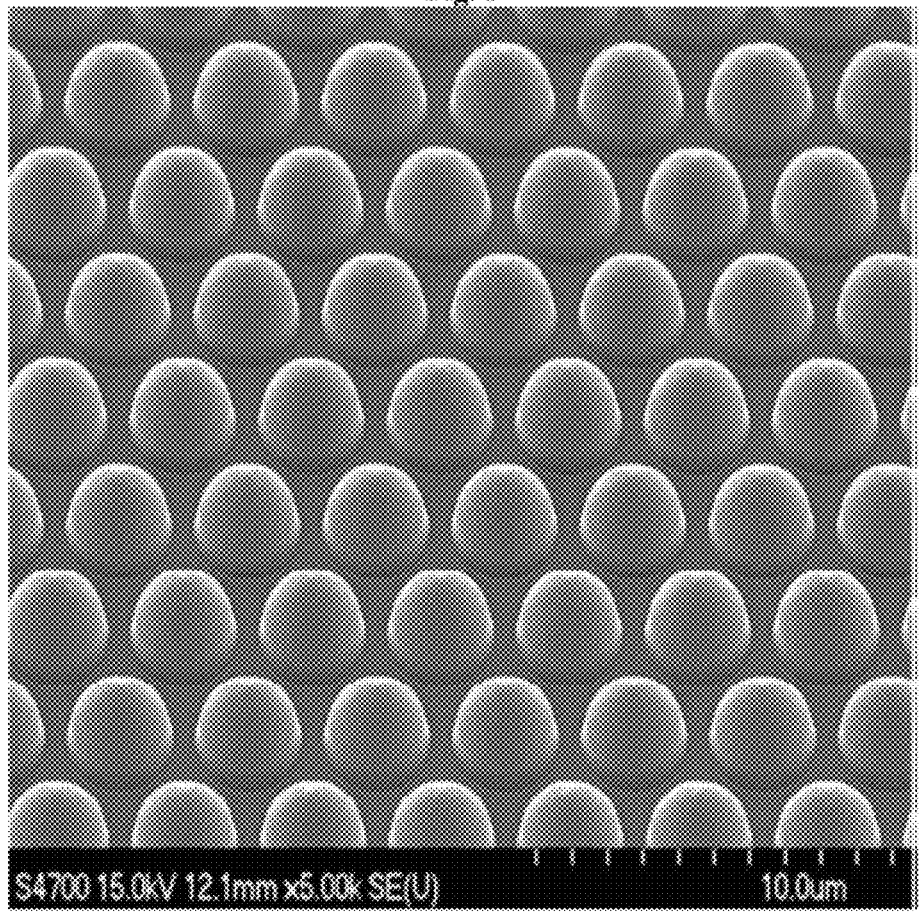
FIG. 5 is a scanning electron microscopy (SEM) photograph of the circular uneven patterns formed through the process of FIG. 3.

In addition, as illustrated in FIG. 4, an array of circular uneven patterns may be formed on the sapphire substrate 110 through the above-described processes. FIG. 5 is a SEM photograph of the circular uneven patterns formed through an actual process.

In step S11, the use of the positive PR has been exemplarily described. In a case where a negative PR is used, the PR 111 remains in an unexposed region, and an anisotropic etching process may be performed to form uneven patterns having a shape opposite to those of FIG. 4 or 5. That is, the uneven patterns may be formed such that the depressed portions and the prominent portions in FIG. 4 or 5 are opposite to each other.

Figure 6:
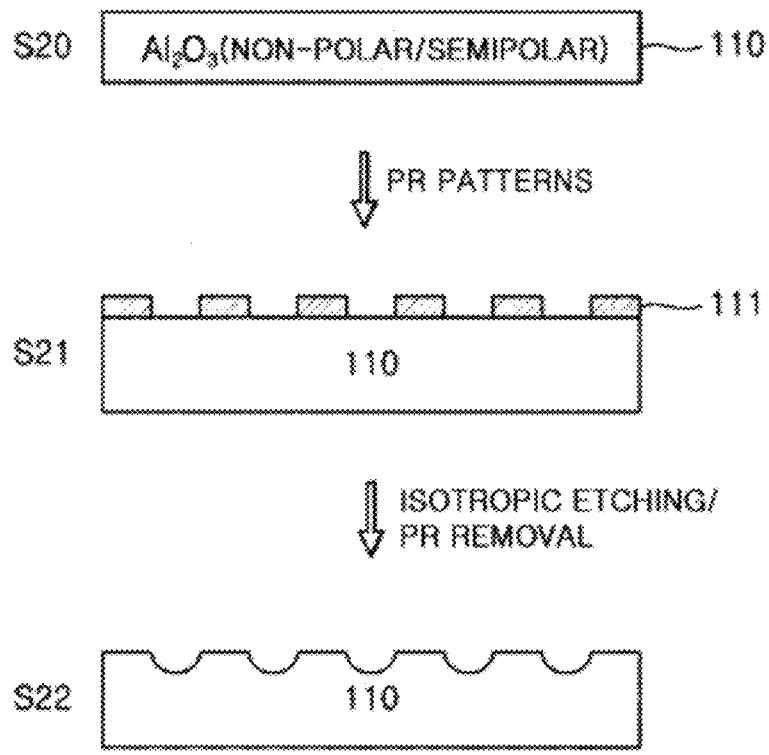
FIG. 6 is a cross-sectional view for explaining a process of forming circular uneven patterns on a sapphire substrate according to another embodiment of the present invention.

FIG. 6 is a cross-sectional view for explaining a process of forming circular uneven patterns on a sapphire substrate according to another embodiment of the present invention.

First, a sapphire substrate 110, which enables the growth of a non-polar or semi-polar nitride semiconductor layer, is prepared (S20).

A photoresist (PR) is coated on the sapphire substrate 110, and a photolithography process of exposing the coated PR using a photo mask having circular patterns (arrays) is performed to form circular PR patterns 111 on the sapphire substrate 110 (S21).

Figure 7:
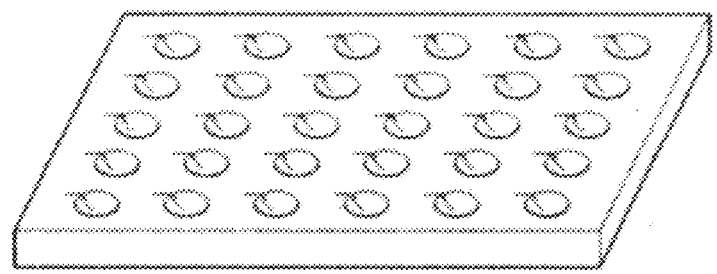
FIG. 7 is a perspective view of the circular uneven patterns formed through the process of FIG. 6.
Figure 8:
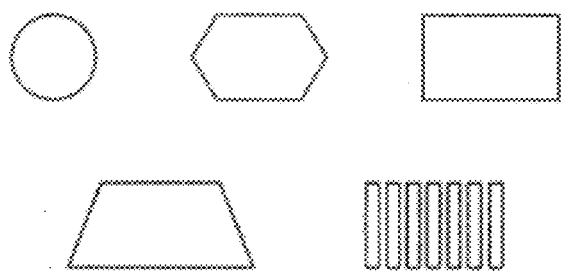
FIG. 8 is a view for explaining a variety of mask patterns according to an embodiment of the present invention.

The circular PR patterns 111 formed on the sapphire substrate 110 are etched through an isotropic etching process using an acid solution (e.g., $H_2SO_4$ solution) or an alkali solution (e.g., KOH or NaOH solution) (S22). Accordingly, regions other than the region where the PR patterns 111 remain on the sapphire substrate 110 may be etched. After the etching process, the remaining PR is removed. Then, uneven patterns etched in a circular groove shape, as illustrated in FIG. 7, may be formed under the surface of the sapphire substrate 110 through an appropriate cleaning process.

In the isotropic etching process (step S21), the use of the positive PR has been exemplarily described. In a case where a negative PR is used, the PR 111 remains in an unexposed region, and an isotropic etching process may be performed to form uneven patterns having a shape opposite to those of FIG. 7. That is, the uneven patterns may be formed in a shape similar to those of FIG. 4 or 5.

The uneven patterns are not limited to the circular shape. For example, PR patterns may be formed using a photo mask on which a pattern of a circular shape, a multi-line (stripe) shape, or a variety of polygonal shape including a triangular shape or a rectangular shape is formed. Then, uneven patterns having various shapes may be formed on the sapphire substrate 110 through the anisotropic etching process or the isotropic etching process.

The height of the uneven pattern may be in a range of several tens of nanometers to several hundreds of micrometers (for example, 10 nanometers to 100 micrometers). FIG. 4 shows a case where the uneven patterns were formed to have a height of 1.5 micrometers. In addition, the array of the uneven patterns may be formed to have a width of several tens of nanometers to several hundreds of micrometers (for example, 10 nanometers to 100 micrometers) at each interval (distance between the centers of the patterns) of several tens of nanometers to several hundreds of micrometers (for example, 10 nanometers to 100 micrometers). FIG. 4 shows a case where the uneven patterns were formed to have an interval of 4 micrometers and a width of 3 micrometers.

Figure 9:
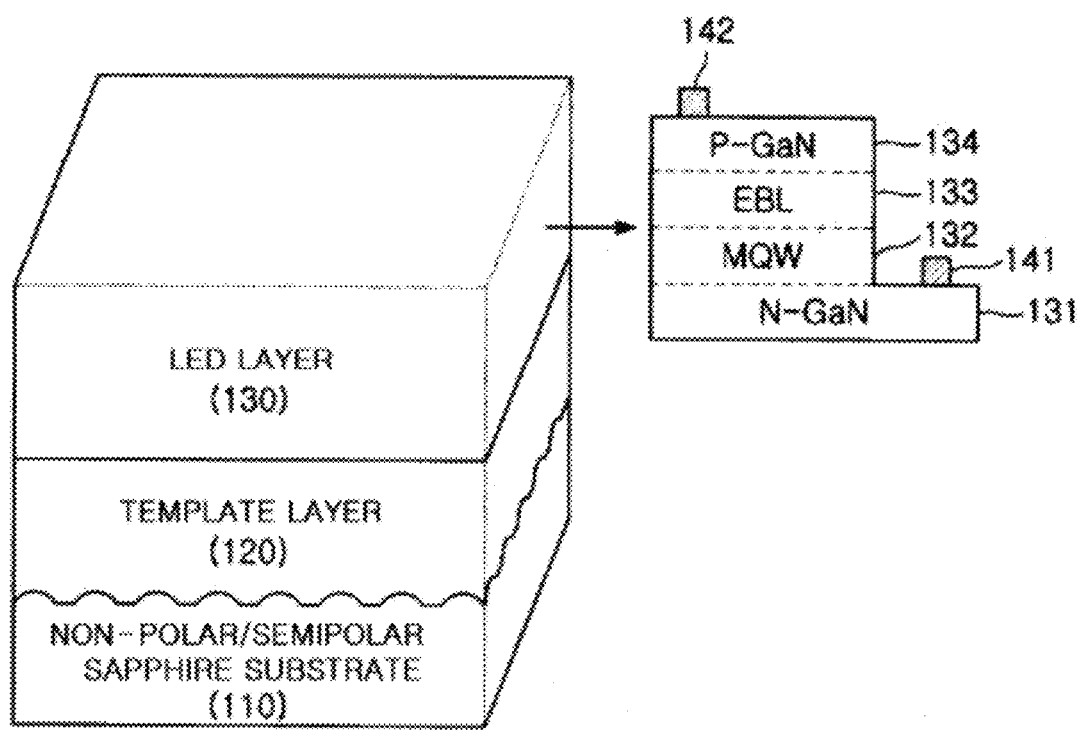
FIG. 9 is a cross-sectional view for explaining a structure of a semiconductor optical device according to an embodiment of the present invention.

FIG. 9 is a cross-sectional view for explaining a structure of a semiconductor optical device 100 according to an embodiment of the present invention.

Referring to FIG. 9, the semiconductor optical device 100 according to the embodiment of the present invention includes a sapphire substrate 110, a template layer 120, and an LED layer 130. In the sapphire substrate 110, uneven patterns described above are formed on a crystal plane (for example, an A-plane, an M-plane, or an R-plane), which enables the growth of a non-polar or semi-polar nitride semiconductor layer. The template layer 120 and the LED layer 130 are formed on the sapphire substrate 110.

The sapphire substrate 110 with the uneven patterns formed on the crystal plane (the A-plane, the M-plane, or the R-plane) of the substrate is prepared. The template layer 120 formed of a non-polar or semi-polar nitride semiconductor layer may be grown on the sapphire substrate 110 through a vacuum deposition process, such as metal organic chemical vapor deposition (MOCVD). The LED layer 130 may be grown on the template layer 120.

The template layer 120 includes a nitride semiconductor layer and an undoped GaN layer. For example, a low-temperature nitride semiconductor layer having an empirical formula of $In_xAl_yGa_{1-x-y}N$ ($0 \leq x \leq 1$, $0 \leq y \leq 1$, $0 \leq x+y \leq 1$) may be formed to a thickness of 10 to 20,000 Å at a certain temperature within a temperature range of 400 to 700° C., and a high-temperature undoped GaN layer may be formed on the low-temperature nitride semiconductor layer. The high-temperature undoped GaN layer may be grown at a high temperature, for example, at a certain temperature within a temperature range of 800 to 1,100° C., and may be formed to a thickness of 10 to 20,000 Å. Furthermore, in order to further reduce a crystal defect, such as a point defect and a line defect, on the surface of the GaN layer, a high-temperature nitride semiconductor layer may be further formed between the low-temperature nitride semiconductor layer and the high-temperature undoped GaN layer, which constitute the template layer 120. The high-temperature nitride semiconductor layer may have an empirical formula of $In_xAl_yGa_{1-x-y}N$ ($0 \leq x \leq 1$, $0 \leq y \leq 1$, $0 \leq x+y \leq 1$), and may be formed to a thickness of 10 to 20,000 Å at a certain temperature within a temperature range of 700 to 1,100° C.

Many crystal defects may exist on the template layer in which a non-polar or semi-polar nitride semiconductor layer is deposited using a flat sapphire substrate. On the contrary, if the template layer 120 having the unevenly patterned structure is formed according to the embodiment of the present invention, the crystal defects may be considerably reduced. The reduction in the crystal defects is derived from the crystal growth of a horizontal direction due to the unevenly patterned structure. The uniform non-polar or semi-polar nitride semiconductor layer with reduced crystal defects can be verified from FIG. 10.

Figure 10:
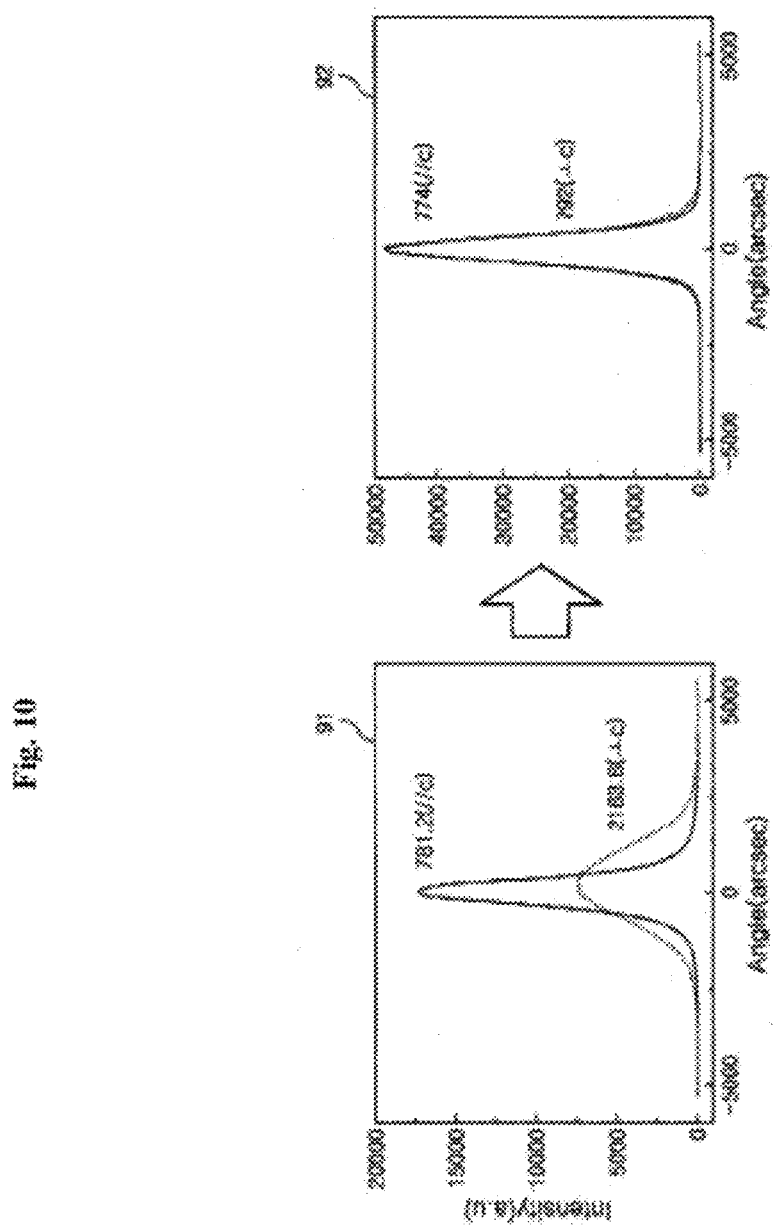
FIG. 10 is a view for explaining XRD peaks in a semiconductor optical device structure of the related art and a semiconductor optical device structure of the present invention.

As can be seen from XRD intensity of FIG. 10, in a case (91) where a GaN layer was formed without forming the uneven patterns, a full-width at half maximum (FWHM) value for the surface of the GaN layer was about 781.2 arcsec in a direction (//C) parallel to the C-direction and was about 2163.6 arcsec in a direction ($\perp$C) perpendicular to the C-direction. The result of FIG. 10 was obtained when the R-plane was used as the sapphire crystal plane and the non-polar GaN layer was formed in a direction perpendicular to the A-plane.

On the other hand, in the XRD measurement of the surface of the undoped GaN layer in a case (92) where the uneven patterns were formed, an FWHM value was about 774 arcsec in a direction (//C) parallel to the C-direction and was about 792 arcsec in a direction (⊥C) perpendicular to the C-direction.

As described above, the FWHM value obtained in the structure of the present invention is much smaller than that obtained in the structure of the related art. This represents that the degree of crystallinity in the structure of the present invention is higher than that in the structure of the related art.

In a case where the template layer 120, in which the crystal defects are remarkably reduced and the degree of crystallinity is improved, is formed and then the semiconductor optical device structure, such as an LED, an LD, a photo detector, or a solar cell, is formed on the template layer 120, it may be possible to suppress a piezoelectric effect occurring in a polar nitride semiconductor layer included in the structure of the related art. Moreover, an electron-hole recombination rate in the optical device may be increased, improving the quantum efficiency thereof. As a result, the brightness of the optical device may be improved.

For example, in a case where the LED layer 130 is formed on the template layer 120, the LED layer 130 may have a structure in which active layers 132 and 133 are disposed between an n-type nitride semiconductor layer 131 and a p-type nitride semiconductor layer 134, as illustrated in FIG. 9.

The n-type nitride semiconductor layer 131 may be formed by growing a GaN layer doped with impurities, such as Si, to a thickness of about 2 micrometers.

The active layers 132 and 133 may include a multi quantum well (MQW) layer 132 and an electron blocking layer (EBL) 133. Specifically, the MQW layer 132 is formed by alternately laminating a GaN barrier layer (about 7.5 nanometers) and an $In_{0.15}Ga_{0.85}N$ quantum well layer (about 2.5 nanometers) several times (for example, five times). The electron blocking layer 133 is formed using an $Al_{0.12}Ga_{0.88}N$ layer (about 20 nanometers).

The InGaN quantum well layer and the GaN barrier layer of the MQW layer 132 may be doped at a Si dopant concentration of about $1 \times 10^{19}/cm^3$, and the electron blocking layer 133 may be doped at a Mg dopant concentration of about $5 \times 10^{19}/cm^3$. Although the $In_{0.15}Ga_{0.85}N$ quantum well layer has been described as an example of the InGaN quantum well layer, the invention is not limited thereto. Like $In_xGa_{1-x}N$ (0<x<1), a ratio of In and Ga may be changed. In addition, although the $Al_{0.12}Ga_{0.88}N$ layer has been described as an example of the electron blocking layer 133, the invention is not limited thereto. Like $Al_xGa_{1-x}N$ (0<x<1), a ratio of Al and Ga may be changed. Furthermore, the InGaN quantum well layer and the GaN barrier layer of the MQW layer 132 may be doped with at least one of O, S, C, Ge, Zn, Cd, and Mg, as well as Si.

The p-type nitride semiconductor layer 134 may be formed by growing a GaN layer doped at an Mg dopant concentration of about $5 \times 10^{19}/cm^3$ to a thickness of about 100 nanometers.

Electrodes 141 and 142 for applying voltages may be formed on the n-type nitride semiconductor layer 131 and the p-type nitride semiconductor layer 134, respectively. The completed LED may be mounted on a predetermined package substrate and function as an individual optical device.

Figure 11:
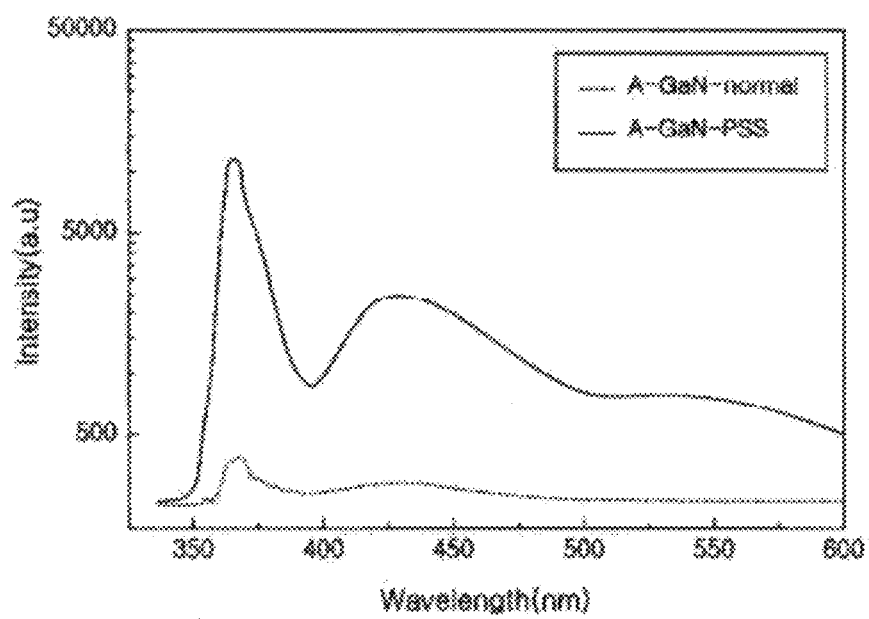
FIG. 11 is a graph for comparing photoluminescence (PL) intensities between the semiconductor optical device structure of the related art and the semiconductor optical device structure of the present invention.

As can be seen from FIG. 11, in a case where an R-plane was used as a sapphire crystal plane and a non-polar GaN layer is formed in a direction perpendicular to an A-plane, PL intensity was low in a conventional LED (A-GaN-normal) having no uneven patterns. On the contrary, like in the embodiment of the present invention, in a case (A-GaN-PSS) where uneven patterns were formed on a sapphire crystal plane, it was verified that PL intensity at a corresponding visible light wavelength was high.

As described above, not only the LED layer 130 but also other semiconductor electronic devices or other semiconductor optical device structures, such as an LD, a photo detector, or a solar cell, may be formed on the template layer 120, as illustrated in FIG. 9. A piezoelectric effect may be suppressed at the active layers 132 and 133, and so on. Therefore, the electron-hole recombination rate and the quantum efficiency may be improved, contributing to the performance (e.g., brightness) improvement of the devices.

While the embodiments of the present invention has been described with reference to the specific embodiments, it will be apparent to those skilled in the art that various changes and modifications may be made without departing from the spirit and scope of the invention as defined in the following claims.

The invention claimed is:

1. A method for manufacturing a semiconductor device, the method comprising:
    etching a sapphire substrate to form uneven patterns thereon, the sapphire substrate comprising an A-plane or M-plane crystal plane; and
    forming a template layer on the etched sapphire substrate, wherein forming the template layer comprises:
        forming a low-temperature nitride semiconductor layer at a temperature in the range of 400 to 700° C.;
        forming a high-temperature nitride semiconductor layer at a temperature in the range of 700 to 1100° C.; and
        forming an undoped GaN layer at a temperature in the range of 800 to 1100° C., and
    wherein the low-temperature nitride semiconductor layer of the template layer contacts the sapphire substrate.

2. The method of claim 1, wherein the low-temperature nitride semiconductor layer and the high-temperature nitride semiconductor layer each comprise $In_xAl_yGa_{1-x-y}N$ ($0 \leq x \leq 1$, $0 \leq y \leq 1$, $0 \leq x+y \leq 1$).

3. The method of claim 1, wherein etching the sapphire substrate to form uneven patterns comprises:
    forming photoresist patterns corresponding to the uneven patterns on the sapphire substrate; and
    etching the photoresist patterns using an anisotropic etching process comprising inductively coupled plasma etching.

4. The method of claim 1, wherein etching the sapphire substrate to form uneven patterns comprises:
    forming photoresist patterns corresponding to the uneven patterns on the sapphire substrate; and
    etching the photoresist patterns using an isotropic etching process using an acid solution or an alkali solution.

5. The method of claim 1, wherein the uneven patterns comprise a polygonal shape, a circular shape, a semicircular shape, a triangular shape, or a rectangular shape.

6. The method of claim 1, wherein an array of the uneven patterns is formed so that each uneven pattern comprises a width of 10 nanometers to 100 micrometers and a height of 10 nanometers to 100 micrometers, and an interval between each uneven pattern is 10 nanometers to 100 micrometers.

7. The method of claim 1, further comprising:
    forming a light-emitting diode (LED) layer on the template layer,
    wherein forming the LED layer comprises growing an n-type nitride semiconductor layer on the template layer, growing at least one active layer on the n-type nitride semiconductor layer, and growing a p-type nitride semiconductor layer on the at least one active layer.

8. The method of claim 1, further comprising:
coating a photoresist on the sapphire substrate before etching the sapphire substrate; and
exposing the photoresist using a photo mask comprising a pattern array,
wherein etching the sapphire substrate is performed using the exposed photoresist.

9. The method of claim 1, wherein the template layer comprises a non-polar or semi-polar nitride semiconductor layer.

10. The method of claim 1, wherein the thickness of each of the low-temperature nitride semiconductor layer, the high-temperature nitride semiconductor layer, and the undoped GaN layer is in the range of 10 to 20,000 Å.

* * * * *